United States Patent [19]
Ritter

[11] 4,342,968
[45] Aug. 3, 1982

[54] ALTERNATING VOLTAGE AMPLIFIER CIRCUIT HAVING A PLURALITY OF SEMICONDUCTOR AMPLIFIER ELEMENTS OPERATED IN A GROUNDED GATE OR GROUNDED BASE CONFIGURATION

[75] Inventor: Gerhard Ritter, Thaining, Fed. Rep. of Germany

[73] Assignee: Siemens Aktiengesellschaft, Berlin & Munich, Fed. Rep. of Germany

[21] Appl. No.: 127,958

[22] Filed: Mar. 7, 1980

[30] Foreign Application Priority Data

Apr. 27, 1979 [DE] Fed. Rep. of Germany ....... 2917275

[51] Int. Cl.³ .............................................. H03F 3/68
[52] U.S. Cl. ................................... 330/295; 330/277; 179/170 T
[58] Field of Search .................... 179/170 T; 330/277, 330/295, 297, 300

[56] References Cited

U.S. PATENT DOCUMENTS

| 3,175,050 | 3/1965 | Oxman | 179/170 T |
| 3,519,765 | 7/1970 | Huber | 179/170 T |
| 4,158,178 | 6/1979 | Schade, Jr. | 330/277 |

FOREIGN PATENT DOCUMENTS 2646035  5/1980  Fed. Rep. of Germany .

Primary Examiner—Michael J. Tokar
Attorney, Agent, or Firm—Hill, Van Santen, Steadman, Chiara & Simpson

[57] ABSTRACT

An alternating voltage amplifier circuit has a plurality of semiconductor amplifier elements, preferably field effect transistors, operated in a grounded gate (base) configuration. The amplification direction is not to be determined until the application of specific operating voltages and is reversible by means of reversing such voltages. At least two semiconductor amplifier elements are provided in parallel to one another. One of the semiconductor amplifier elements is effective in one direction of amplification as an input amplifier and, with the other semiconductor amplifier element, in the other amplification direction has a power amplifier, the other semiconductor amplifier element being connectible or disconnectible upon reversal of the amplification direction.

13 Claims, 4 Drawing Figures

FIG 1
FIG 1a
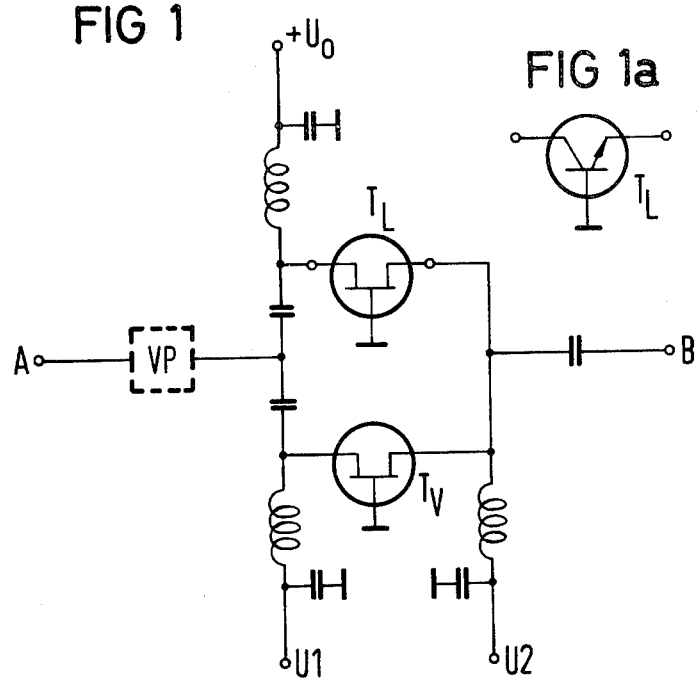
FIG 2
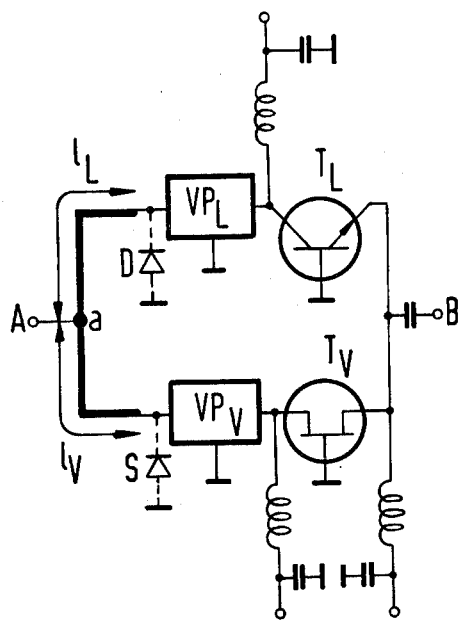
FIG 3
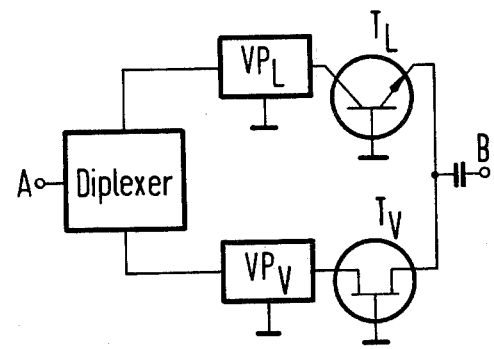

ALTERNATING VOLTAGE AMPLIFIER CIRCUIT HAVING A PLURALITY OF SEMICONDUCTOR AMPLIFIER ELEMENTS OPERATED IN A GROUNDED GATE OR GROUNDED BASE CONFIGURATION

BACKGROUND OF THE INVENTION

1. Field of the Invention

The present invention relates to voltage amplifiers, and more particularly to voltage amplifiers which have a plurality of semiconductor amplifiers operated in a grounded gate or a grounded base configuration.

2. Description of the Prior Art

In symmetrically constructed semiconductor elements, for example, symmetrically doped transistors or field effect transistors, the outer electrodes receive their significance as emitter and collector or, respectively, as source and drain only by means of application of corresponding operating voltages. If drives such as a semiconductor amplifier element into grounded base or, respectively, grounded gate configuration, then, by reversing the operating voltages, the amplification direction of the semiconductor amplifier element can also be reversed. Because of this, matching problems arise as a rule, on the one hand, from the fact that the respective input resistance of the semiconductor amplifier element is relatively low, but the respective output resistance, on the other hand, is relatively high, and these problems arise particularly when a resistor terminating the semiconductor amplifier on one side must be matched to the relatively low input resistance of the semiconductor amplifier element and, to its relatively high output resistance. The terminating resistance represents the source or the load resistance, depending on the operating direction of the semiconductor amplifier. Other problems include, the power consumption with respect to differing amplification demands, particularly when the semiconductor amplifier is to operate in one amplification direction as an input amplifier for relatively small signal levels and is to operate in the other amplification direction as an output amplifier, i.e. as a power amplifier. Such problems can particularly arise when it is a matter of the first or, respectively, last link of an entire chain of semiconductor amplifier elements which can be reversed in amplification direction, as is known, for example, from the German published application No. 26 46 035.

For matching one and the same resistor for both amplification directions, it is known from the German published application No. 26 46 035, for an alternating voltage circuit having a plurality of semiconductor amplifier elements operated in a grounded base (gate) configuration, whose amplification direction is determined by the application of specific voltages and, therefore, can be reversed by means of changing these voltages, to provide an operating direct voltage feed for the emitter electrode (source) and for the collector electrode (drain) of the individual semiconductor amplifier elements. The operating direct voltage feed is designed mutually reversible. It is also known to iteratively connect the semiconductor amplifier elements in stages upon interposition of a respective four-terminal network having a band pass character which, for both amplification directions, transforms the respective output resistance of one stage into the input resistance of the succeeding stage in terms of operating direction and to thereby employ switchable components in the transforming four-terminal network, whereby, upon reversal of the amplification direction, semiconductor diodes which are likewise to be reversed can be employed for reversing these components.

SUMMARY OF THE INVENTION

In contrast to the foregoing, the object of the present invention is to provide, on the one hand, the elimination of such switchable components in a transforming four-terminal network which is pre-connected or post-connected to the actual semiconductor amplifier, and to nonetheless render possible a desired matching of the input resistance or, respectively, of the output resistance of the semiconductor amplifier which is reversible in its amplification direction to its signal source or, respectively, load, given identity or equality of source and load resistance. On the other hand, it is also within this object of the invention to avoid an unnecessarily high power consumption.

The present invention relates to an alternating voltage amplifier circuit having a plurality of semiconductor amplifier elements, particularly field effect transistors, operated in a grounded gate (base) configuration and whose amplification direction is fixed only by means of the application of specific operating voltages and can be reversed by means of reversing these operating voltages. Such an alternating voltage amplifier circuit is constructed, according to the present invention, such that at least two semiconductor amplifier elements are provided in parallel to one another, of which one semiconductor amplifier element is effective both upon operation of the alternating voltage amplifier circuit as an input amplifier in one amplification direction as well as upon operation of the alternating voltage amplifier circuit as a power amplifier in the other amplification direction, whereas the other semiconductor amplifier element is connectible or disconnectible upon reversal of the amplification direction.

The invention, which can particularly find use in the output/input stage of a chain of semiconductor amplifiers having a reversible amplification direction, provides the advantage of being able to achieve at least approximately identical operating resistances of the alternating voltage amplifier circuit in both amplification directions and, at the same time, making due, upon operation of the alternating voltage amplifier circuit as an input amplifier, with a semiconductor amplifier element of significantly smaller steepness than is the case upon operation of the alternating voltge amplifier circuit as a power amplifier, whereby, in the first operating case, the power consumption is at the same time correspondingly reduced.

According to a further development of the invention both the one semiconductor amplifier element and the other semiconductor amplifier element can exhibit a field effect transistor. However, it is also advantageous that, in accordance with a further development of the invention, the one semiconductor amplifier element has a field effect transistor but, each of the other or further amplifier elements has a bipolar transistor. Such a bipolar transistor which, given greatly differing dopings of the collector zone and the emitter zone would be less suitable for a reversal of its amplification direction, at present allows of greater outputs than field effect transistor and, to that degree, seems particularly advantageous as a connectible and disconnectible power amplifier element effective only in the one amplification direction.

BRIEF DESCRIPTION OF THE DRAWING

Other objects, features and advantages of the invention, its organization, construction and operation will be best understood from the following detailed description, taken in conjunction with the accompanying drawing, on which:

FIG. 1 is a schematic circuit diagram of an exemplary embodiment of an alternating voltage amplifier circuit constructed in accordance with the present invention and having two semiconductor amplifier elements which are provided as field effect transistors;

FIG. 1a is a schematic circuit diagram of a bipolar transistor which may be employed for the realization of one of the semiconductor amplifier elements of FIG. 1;

FIG. 2 is a schematic circuit diagram of an alternating voltage amplifier circuit which contains separate matching quadripoles in its two parallel branches; and FIG. 3 is a schematic circuit diagram of an alternating voltage amplifier circuit in which the two parallel branches are connected together by way of a diplexer.

DESCRIPTION OF THE PREFERRED EMBODIMENTS

Referring to FIG. 1, a semiconductor alternating voltage amplifier is illustrated which is to be employed, in particular, as an output/input stage of, for example, a chain of semiconductor amplifier elements reversible in the amplification direction as is known from the German published application No. 26 46 035, in which, according to the present invention, two semiconductor amplifier elements $T_V$, $T_L$ are provided, for example, by means of two field effect transistors and, thereby, are integrated on a chip if needed, or are combined in a common housing in a hybrid circuit parallel to one another. This amplifier circuit is connected between two terminals A and B, of which terminal A may form the output/input of such a chain of semiconductor amplifier elements which is reversible in the amplification direction, and in which the terminal B then connects to the next element of such an amplifier chain.

Such a terminal stage of an amplifier chain should, on the one hand, emit a corresponding output when operated as an output stage, and, on the other hand, it need process only small signal levels upon operation as an input stage. By employing field effect transistors, a relatively great channel width is required for the power amplifier operation, whereas a relatively small channel width is advantageous for input amplifier operation. If, to that end, one considers the connection resistances necessary for matching, then approximately $R_L \approx U_o^2/2P$ defines the load resistance $R_L$ for power amplifier operation, where $U_o$ is the operating voltage and P is the output signal; and for operation as an input amplifier, $R_Q \approx 1/S$, defines the source resistance $R_Q$, where S is the steepness of the semiconductor amplifier element. Given a predetermined signal output P and, therefore, a predetermined required channel width of the field effect transistor for power amplifier operation, an appropriate channel width of the field effect transistor can be found for its operation as an input amplifier, at which channel width the two resistances $R_L$ and $R_Q$ are equal.

To this end, and according to the present invention, upon reversal of the amplification direction, the degree of actually available channel width that is additionally required for power amplifier operation is, in a certain sense, added, or, respectively, is switched off upon operation as an input amplifier as not being required. The one semiconductor amplifier element $T_V$ of the two amplifier elements $T_V$, $T_L$ connected in parallel to one another is effective both upon operation of the alternating voltage amplifier circuit in FIG. 1 as an input amplifier in the one direction, namely in the amplification direction A-B, and upon operation of the alternating voltage amplifier circuit as a power amplifier in the other amplification direction B-A, whereas the further semiconductor amplifier $T_L$ is connected or, respectively, disconnected upon reversal of the amplification direction. This is achieved in the alternating voltage amplifier circuit of FIG. 1 by means of the differing operating voltages U1 and U2 supplied to the semiconductor amplifier elements $T_V$, $T_L$.

If the operating voltage U1 supplied to the electrode facing the terminal A is positive and the operating voltage U2 supplied to the electrode facing the terminal B is negative, then the alternating voltage amplifier circuit of FIG. 1 operates as a power amplifier in the direction B-A, whereby the field effect transistor $T_L$ supplies the primary component of the output. To that end, the field effect transistor $T_L$ can, in turn, be realized as a parallel connection of, for example, four field effect transistors, this not being illustrated in greater detail in FIG. 1.

If, on the other hand, the operating voltage U1 is negative and the operating voltage U2 is positive, then the field effect transistor $T_L$ is blocked and the field effect transistor $T_V$ now operates alone as an input amplifier in the amplification direction A-B.

Whereas the one semiconductor amplifier $T_V$ of the circuit arrangement of FIG. 1 can thus be operated in both amplification directions, the further semiconductor amplifier element $T_L$ is operated in only one amplification direction and, to this end, is added given the change to this amplification direction and is again switched off upon change to the other amplification direction. Thereby, the further semiconductor amplifier element $T_L$ of the circuit arrangement according to FIG. 1 can also be formed by means of a bipolar transistor, as is indicated in FIG. 1a or, respectively, by means of a parallel connection of a plurality of bipolar transistors, also not illustrated in further detail on the drawing. Such bipolar transistors are of advantage, particularly when the outputs attainable therewith are higher than the outputs of field effect transistors. On the other hand, realization by means of a field effect transistor is preferred for a semiconductor amplifier element $T_V$ to be alternately operated in both amplification direction because of its better properties of symmetry.

It has already been pointed out above that the further semiconductor amplifier element $T_L$ in the circuit arrangement according to FIG. 1 which can be connected or, respectively disconnected upon reversal of the amplification direction can be realized by means of the parallel connection of a plurality of such semiconductor amplifier elements. In addition, the further semiconductor amplifier element or elements $T_L$ can be connected with additional such semiconductor amplifier elements to form a multi-stage amplifier, this also not being illustrated in greater detail in FIG. 1. Thereby, for example, it can be a matter of a three-stage amplifier constructed with commercially available small-signal silicon field effect transistors, the semiconductor amplifier elements $T_L$ in such a three-stage amplifier's individual stages being respectively subject to realization by means of a parallel connection of four field effect transistors. In such an amplifier processing, for example, 300 MHz signals, an amplification of, for example, 30 dB and an output of, for example 100 mW can be achieved.

Also illustrated in FIG. 1 is a matching quadripole VP which may be required under certain conditions in the illustrated voltage amplifier circuit, with which, as mentioned above, a matching of the operating resistances in both amplification directions can be achieved, the matching quadripole VP being necessary since the operating resistances in general will not be equal to the load or, respectively, source resistance from the very beginning.

If one wishes to obtain greater outputs and at the same time realize the semiconductor amplifier element $T_V$ of FIG. 1 with a commercially available small-signal field effect transistor, then it can also be advantageous to provide separate matching quadripoles which, under certain conditions, can also be switched off for the semiconductor amplifier element $T_V$ and for the semiconductor amplifier element $T_L$.

An exemplary embodiment of the foregoing is illustrated in FIG. 2. In the alternating voltage amplifier circuit of FIG. 2, the one semiconductor amplifier element $T_V$ which is singlely effective upon input amplifier operation from the terminal A to the terminal B is again formed by means of a field effect transistor, whereby a separate matching quadripole $VP_V$ is provided in the circuit branch containing the field effect transistor $T_V$. The other semiconductor amplifier element $T_L$ which is only effective upon amplifier operation from the terminal B to the terminal A is formed by means of a bipolar transistor $T_L$. A PIN diode D can be provided for cutting off the circuit branch; and a transmission line $1_L$ of such length can be provided between the input/output terminal A or, respectively, a branching point a of the two circuit branches and the matching quadripole $VP_L$ so that the transmission line $1_L$, given a blocked transistor $T_L$ (whereby the transmission line $1_L$ is then practically terminated with a pure reactive impedance), represents an open line (no load operation at the branching point a).

A corresponding transmission line $1_V$ is connected between the branching point a and the matching quadripole $VP_V$ in the other branch circuit, as illustrated in FIG. 2. Given higher outputs, it is advantageous for the protection of this line branch forming, so to speak, the small-signal branch, to provide a PIN diode switch S in the line leading to the input of the matching quadripole $VP_V$, as is also illustrated in FIG. 2.

A further exemplary embodiment of an alternating voltage amplifier circuit constructed in accordance with the present invention is illustrated in FIG. 3. In this circuit arrangement, also, the one branch containing a field effect transistor $T_V$ as one semiconductor amplifier element and forming, so to speak, the small-signal branch, and the other line branch containing a bipolar transistor $T_L$ as the other semiconductor amplifier element and forming, so to speak, the power branch, also provides respective matching quadripoles $VP_V$ and $VP_L$. The interconnection of the parallel branches containing the two semiconductor amplifier elements $T_V$, $T_L$ here occurs with the assistance of the diplexer, i.e. by means of a frequency dividing network; and such an interconnection of the two parallel branches is to be particularly recommended when the frequencies of the signals to be processed for operation as an input amplifier differs significantly from the frequencies of the signals to be processed when operating as a power amplifier.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An alternating voltage amplifier circuit which is reversible in respect of its amplification direction, comprising:
   a first input/output terminal and a second input/output terminal defining a first amplification direction from said first input/output terminal towards said second input/output terminal and a second amplification direction from said second input/output terminal towards said first input/output terminal;
   a first semiconductor amplifier element and at least one further semiconductor element, each of said semiconductor elements including a control electrode connected to a reference potential, a first main electrode coupled to said first input/output terminal and a second main electrode coupled to said second input/output terminal;
   said first main electrode of said further semiconductor amplifier element connected to an operating potential and said second main electrodes connected together;
   first and second control voltage terminals for receiving a first control voltage polarity thereacross for one amplification direction and a second control voltage polarity thereacross for the other amplification direction; and
   said first and second main electrodes of said first semiconductor amplifier element connected to said first and second control terminals, respectively, both of said semiconductor amplifier elements responsive to the first control voltage polarity to operate in the second amplification direction and only said first semiconductor amplifier element responsive to said second control voltage polarity to operate in the first amplification direction.

2. The amplifier circuit of claim 1, wherein:
   each of said semiconductor amplifier elements is a field effect transistor.

3. The amplifier circuit of claim 1, comprising:
   a plurality of said further semiconductor amplifier elements connected in parallel.

4. The amplifier circuit of claim 3, wherein:
   each of said semiconductor amplifier elements is a field effect transistor.

5. The amplifier circuit of claim 1, wherein:
   said semiconductor amplifier elements are integrated on the same chip.

6. The amplifier circuit of claim 1, wherein:
   said semiconductor amplifier elements are mounted in a common housing.

7. The amplifier circuit of claim 1, wherein:
   said first semiconductor amplifier element is a field effect transistor; and
   said further semiconductor amplifier element is a bipolar transistor.

8. The amplifier circuit of claim 1, comprising:

a plurality of said further semiconductor amplifier elements connected to form a multi-stage amplifier.

9. The amplifier circuit of claim 1, comprising:
a matching quadripole commonly coupling said first main electrodes to said first input/output terminal.

10. The amplifier circuit of claim 1, comprising:
a pair of matching quadripoles coupling respective first main electrodes to said first input/output terminal.

11. The amplifier circuit of claim 1, comprising:
a pair of transmission lines connected between said first input/output terminal and respective quadripole circuits.

12. An alternating voltage amplifier circuit which is reversible in respect of its amplification direction, comprising:
a first input/output terminal and a second input/output terminal defining a first amplification direction from said first input/output terminal towards said second input/output terminal and a second amplification direction from said second input/output terminal toward said first input/output terminal;
a first semiconductor amplifier element and at least one further semiconductor element, each of said semiconductor elements including a control electrode connected to a reference potential, a first main electrode coupled to said first input/output terminal and a second main electrode coupled to said second input/output terminal;
said first main electrode of said further semiconductor amplifier element connected to an operating potential and said second electrodes connected together;
first and second control voltage terminals for receiving a first control voltage polarity thereacross for one amplification direction and a second control voltage polarity thereacross for the other amplification direction;
said first and second main electrodes of said first semiconductor amplifier element connected to said first and second control terminals, respectively, both of said semiconductor amplifier elements responsive to the first control voltage polarity to operate in the second amplification direction and only said first semiconductor amplifier element responsive to said second control voltage polarity to operate in the first amplification direction;
a pair of matching quadripoles coupling respective first main electrodes to said first input/output terminal; and
a pair of diodes, each of said diodes connected to a respective branch circuit to cut off the respective branch circuit.

13. An alternating voltage amplifier circuit which is reversible in respect of its amplification direction, comprising:
a first input/output terminal and a second input/output terminal defining a first amplification direction from said first input/output terminal towards said second input/output terminal and a second amplification direction from said second input/output terminal toward said first input/output terminal;
a first semiconductor amplifier element and at least one further semiconductor element, each of said semiconductor elements including a control electrode connected to a reference potential, a first main electrode coupled to said first input/output terminal and a second main electrode coupled to said second input/output terminal;
said first main electrode of said further semiconductor amplifier element connected to an operating potential and said second electrodes connected together;
first and second control voltage terminals for receiving a first control voltage polarity thereacross for one amplification direction and a second control voltage polarity thereacross for the other amplification direction;
said first and second main electrodes of said first semiconductor amplifier element connected to said first and second control terminals, respectively, both of said semiconductor amplifier elements responsive to the first control voltage polarity to operate in the second amplification direction and only said first semiconductor amplifier element responsive to said second control voltage polarity to operate in the first amplification direction;
a pair of matching quadripoles coupling respective first main electrodes to said first input/output terminal; and
a diplexer connecting said first input/output terminal to said pair of matching quadripoles.

* * * * *